US007179571B2

(12) United States Patent
Hinsberg, III et al.

(10) Patent No.: US 7,179,571 B2
(45) Date of Patent: *Feb. 20, 2007

(54) APPARATUS FOR CHARACTERIZATION OF PHOTORESIST RESOLUTION, AND METHOD OF USE

(75) Inventors: William Dinan Hinsberg, III, Fremont, CA (US); John Allen Hoffnagle, San Jose, CA (US); Frances Anne Houle, Fremont, CA (US); Martha Inez Sanchez, Menlo Park, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/351,578

(22) Filed: Feb. 9, 2006

(65) Prior Publication Data

US 2006/0126053 A1   Jun. 15, 2006

Related U.S. Application Data

(62) Division of application No. 10/769,132, filed on Jan. 29, 2004, now Pat. No. 7,046,342.

(51) Int. Cl.
*G03F 9/00* (2006.01)

(52) U.S. Cl. ............................ 430/22; 430/30; 430/296; 430/942; 355/77

(58) Field of Classification Search .................. 430/22, 430/30, 296, 942; 355/71, 75, 77; 356/521
See application file for complete search history.

(56) References Cited

U.S. PATENT DOCUMENTS

| | | |
|---|---|---|
| 5,327,218 A | 7/1994 | Igaki |
| 5,473,471 A | 12/1995 | Yamagata et al. |
| 5,574,560 A | 11/1996 | Franz et al. |
| 5,680,211 A | 10/1997 | Kaneda et al. |
| RE35,753 E | 3/1998 | Raab et al. |
| 5,851,701 A | 12/1998 | Rolson |
| 6,057,065 A | 5/2000 | Rolson |
| 6,072,581 A | 6/2000 | Stephenson et al. |
| 6,233,044 B1 | 5/2001 | Brueck et al. |
| 6,249,335 B1 | 6/2001 | Hirukawa et al. |
| 6,291,113 B1 | 9/2001 | Spence |
| 6,433,878 B1 | 8/2002 | Niu et al. |
| 7,046,342 B2 * | 5/2006 | Hinsberg et al. .............. 355/75 |
| 2001/0048512 A1 | 12/2001 | Suzuki et al. |
| 2002/0021434 A1 | 2/2002 | Nomura et al. |
| 2002/0034011 A1 | 3/2002 | Nakai |
| 2003/0148193 A1 | 8/2003 | Shin et al. |

OTHER PUBLICATIONS

D. H. Kelly, "Systems Analysis of the Photograhic Process. II. Transfer Function Measurements", Journal of the Optical Society of America, vol. 51, No. 3, Mar. 1961, pp. 319-330.
J. A. Hoffnagle et al., "Method of measuring the spatial resolution of a photoresist", Optics Letters, vol. 27, No. 20, Oct. 15, 2002, pp. 1776-1778.
M. G. L. Gustafsson et al., "Doubling the lateral resolution of wide-field fluorescence microscopy using structured illumination", Proceedings of SPIE, vol. 3919, 2000, pp. 141-150.
A. Yen et al., "Achromatic holographic configuration for 100-nm-period lithography", Applied Optics, vol. 31, No. 22, Aug. 1, 1992, pp. 4540-4545.
Yih-Shyang Cheng, "Fringe formation in incoherent light with a two-grating interferometer", Applied Optics, vol. 23, No. 18, Sep. 15, 1984, pp. 3057-3059.
J. A. Hoffnagle et al., "Use of Interferometric Lithography to Characterize the Spatial Resolution of a Photoresist Film", Journal of Photopolymer Sci. & Tech., vol. 16, No. 3, 2003, pp. 373-379.

* cited by examiner

*Primary Examiner*—Christopher G. Young
(74) *Attorney, Agent, or Firm*—Daniel E. Johnson

(57) ABSTRACT

An optical apparatus used for the efficient characterization of photoresist material includes at least one grating interferometer having at least two gratings that together define an optical recombination plane. An optical stop blocks any zeroth order beam from propagating through the apparatus. A reticle positioned at the recombination plane has at least one fiducial marking therein. A lithographic imaging optical tool is positioned so that its input optical plane is substantially coincident with the optical recombination plane and its output imaging plane is substantially coincident with photoresist on a wafer. The apparatus writes in the photoresist latent, sinusoidal grating patterns, preferably of different spatial frequencies, as well as at least one fiducial mark whose pattern is determined by the marking in the reticle. After the photoresist is developed, its intrinsic spatial resolution may be determined by automated means.

21 Claims, 2 Drawing Sheets

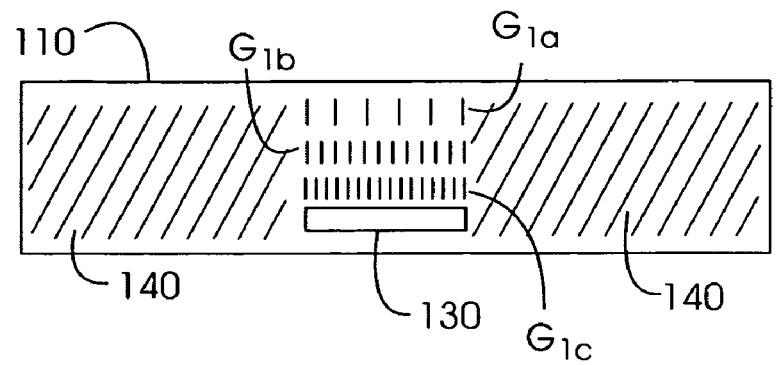
FIG. 2A
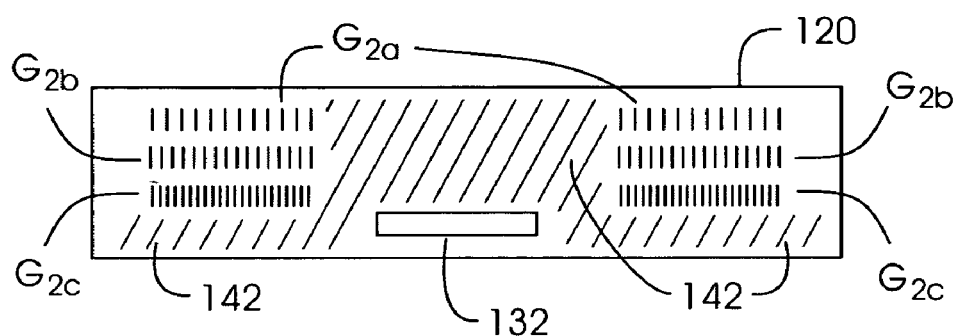
FIG. 2B
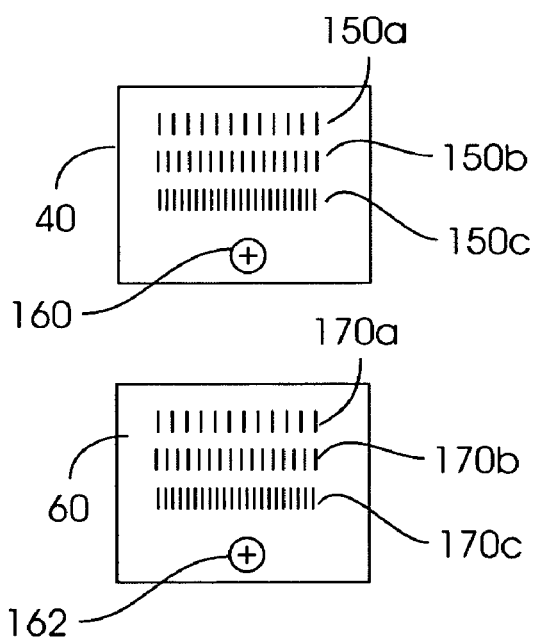
FIG. 2C
FIG. 2D

APPARATUS FOR CHARACTERIZATION OF PHOTORESIST RESOLUTION, AND METHOD OF USE

This application is a division of, and claims priority to, U.S. patent application Ser. No. 10/769,132 filed Jan. 29, 2004 now U.S. Pat. No. 7,046,342 titled "Apparatus for characterization of photoresist resolution, and method of use", which is hereby incorporated by reference in its entirety.

TECHNICAL FIELD

The invention relates to an apparatus and method for characterizing the resolution of a radiation sensitive medium such as a photoresist. More particularly, the invention is directed to an interferometric optical arrangement for accomplishing this characterization.

BACKGROUND

As photolithographic techniques have succeeded in producing ever smaller feature sizes, the demands on the performance of the lithographic imaging system have become increasingly stringent. In particular, the intrinsic ability of the photoresist film, which may be regarded as an element in the imaging system, to resolve small features has become a matter of great concern, since the inherent resolution of a photoresist places a limit on the dimension of the smallest feature that can be produced. Accordingly, the quantitative characterization of a photoresist's spatial response is important for resolution-enhancing technologies such as optical proximity correction (OPC), phase-shifting masks, and modified (or off-axis) illumination, all of which are commonly used in state-of-the-art lithography.

The performance of a photoresist depends not only on its chemical composition, but also on its processing conditions (e.g., the pre- and post-expose bake temperatures and duration, the development time and temperature, etc.) and the environment in which it is used. Because any and all of the conditions that might affect the performance of a photoresist are potentially variable, it is valuable to objectively and quantitatively characterize the spatial resolution of a photoresist film under the photoresist's preferred processing conditions. Ideally, such a characterization should be performed efficiently, i.e., with sufficient speed and ease of use that it can be applied routinely in a realistic manufacturing environment. In practical terms, this necessitates that such a technique be compatible with conventional lithographic tools and procedures.

To this end, a method was recently demonstrated for accurately characterizing the spatial resolution of photoresist materials (see J. A. Hoffnagle, W. D. Hinsberg, M. I. Sanchez, and F. A. Houle, Optics Letters, vol. 27, pp. 1776–1779, 2002). A key step in this methodology is the exposure of the photoresist film to the sinusoidal optical intensity pattern produced by the interference of two coherent, plane-wave beams of wavelength $\lambda$, each of which intercepts the film at an angle $\theta$ (with respect to the normal to the film). This step produces a "grating pattern" in the photoresist film that has a period $\Lambda = \lambda/2 \sin\theta$ and an intensity distribution given by $$I(x) = Dq[1 + \cos(Kx)]/2 \qquad (1)$$

in which D is the dose or total beam energy used to write the grating pattern, q is a coefficient that relates dose to absorbed energy per unit area (and therefore depends on both the beam cross section as well as the absorbitivity and thickness of the film), $K = 2\pi/\Lambda$ is the wave vector of the grating pattern, and x denotes a particular spatial coordinate.

One then assumes that the developable latent image, taken here to be the density $\rho(x)$ of the photoresist polymer that is modified as a result of this exposure, is simply equal to the convolution of the optical illumination pattern and the point-spread function (PSF) of the photoresist. If f(x) represents the line-spread function (LSF), i.e., the one-dimensional analog of the PSF, then it can be shown that $$\rho(x) = p \, Dq[1 + \alpha(K)\cos(Kx)]/2 \qquad (2)$$

in which $\rho$ is a proportionality constant that relates absorbed optical energy density to the density of modified polymer, and $\alpha(K)$ is the modulation transfer function (MTF), which is equal to the Fourier cosine transform of the line-spread function f(x).

Although the latent image in the photoresist film is not generally directly observable, it is possible to determine the MTF (and thus the LSF) from the variation of the developed linewidth with exposure, given a quantitative model of resist development. In the case of a simple threshold model, in which there is a threshold dose below which the photoresist film is not developed, it can be shown that $$D/D_0 = 1/[1 + \alpha(K)\cos(Kt)]/2 \qquad (3)$$

in which t is the developed linewidth, and $D_0$ is the dose that would be necessary to develop the entire exposed region. Thus, it is possible to determine $D_0$ and $\alpha(K)$ for a given beam wavelength $\lambda$ by fitting measurements of developed linewidth t and dose D to equation (3). By repeating this analysis over a range of different incident spatial frequencies, the MTF $\alpha(K)$ can be determined over that range. From the MTF, it is possible to determine the LSF f(x), which is essentially a measure of the photoresist's inherent spatial resolution at a particular wavelength.

Unfortunately, the means used to generate a sinusoidal optical grating in a photoresist film can not be easily integrated with standard photolithographic tools, and this incompatibility greatly limits the usefulness of the method of Hoffnagle et al. described above. The currently preferred method for generating a sinusoidal optical grating relies on the interference of two mutually coherent light beams. If two beams of wavelength $\lambda$ illuminate a surface, and each beam makes an angle $\theta$ with respect to the normal to that surface, then the angle between the two beams is $2\theta$ and the resulting interference pattern is sinusoidal with $$K = 4\pi\sin(\theta)/\lambda \qquad (4)$$

Many interferometers have been designed and built that generate the two required interfering beams, but these are generally special-purpose instruments that must be carefully aligned for each particular value of K (spatial frequency) that is desired. The need to realign an interferometer for each spatial frequency greatly slows the process of generating sets of gratings spanning a large spatial frequency range, which is needed to carry out the procedure described above. Such interferometers have little in common with present-day lithographic exposure tools, which use projection optics to illuminate a reticle and transfer the image of the reticle to a surface.

The method most commonly used for generating a sinusoidal optical grating with a lithographic exposure tool is the non-interferometric one of preparing a reticle on which the transmission of the illuminating light varies sinusoidally.

This approach is impractical for high spatial frequencies and short wavelengths, because of the difficulty of accurately patterning the reticle substrate with a semitransparent material having precisely controlled optical density.

Consequently, there is at present no suitable method for generating sinusoidal optical gratings using conventional lithographic tools. If existing projection exposure tools could be adapted to generate accurate sinusoidal optical gratings at the surface of a photosensitive material in an efficient manner, the methodology of Hoffnagle et al. could be used routinely to characterize the spatial response of the resist materials, which would be of great value for lithography. What is needed therefore, is a technique for integrating interferometric optics with the optics of projection lithography. The present invention satisfies this need.

SUMMARY OF THE INVENTION

An apparatus and method are described for efficiently characterizing the spatial response of a photoresist film. Conventional projection lithographic tools may be advantageously adapted to simultaneously generate both interferometrically and conventionally imaged optical patterns in a resist on a wafer. Thus, it is possible to simultaneously project onto the wafer (i.e., in the same exposure step) many sets of sinusoidal grating patterns of various spatial frequencies as well as non-periodic, arbitrarily shaped features that may serve as alignment marks (also termed "fiducial" marks). These marks facilitate the automated evaluation of the developed photoresist patterns (e.g., using CD-SEM or Critical Dimension-Scanning Electron Microscope). The measured linewidths can then be analyzed to extract the modulation transfer function (MTF), and thus the line-spread function (LSF), for the photoresist under a specific set of processing conditions.

Preferred embodiments and methods disclosed herein make use of an optical arrangement that integrates interferometric and conventional methods for patterning the photoresist. The photoresist advantageously resides on a wafer positioned in a standard lithographic tooling apparatus, so that photoresist on a wafer may be exposed to a full set of grating patterns having different spatial frequencies, thereby eliminating errors due to drift in process conditions which would otherwise arise if each grating pattern were printed on a separate wafer.

One preferred embodiment of the invention is an optical apparatus that includes a first grating interferometer that receives an input optical beam. The interferometer includes at least two gratings $G_1$ and $G_2$ that together define an optical recombination plane in which sinusoidal output is generated. The apparatus further includes an optical stop that blocks a portion of optical radiation passing through the interferometer, and an optical imaging system that receives optical radiation from the interferometer. The optical imaging system includes at least one optical component and has an input focal plane and an output imaging plane, in which the input focal plane is substantially coincident with the recombination plane of the interferometer. The apparatus also includes a reticle that is substantially coincident with the recombination plane, in which the reticle has a pattern that represents information (e.g., fiducial information) to be transferred to the output imaging plane. This information advantageously includes at least one fiducial mark. The gratings $G_1$ and $G_2$ preferably have different periodicities and are formed in a single piece of optical material, e.g., in opposite sides of a single piece of fused silica. The optical imaging system may include, for example, a lens having a focal plane that defines the output imaging plane. The optical stop advantageously blocks zeroth order optical radiation passing through the interferometer, and is preferably located between the interferometer and the optical recombination plane. The apparatus preferably includes a wafer located near the output imaging plane, with the wafer having photoresist thereon that receives optical radiation for producing latent grating patterns in the photoresist. The apparatus may further include additional grating interferometers for receiving the input optical beam. Each of the additional grating interferometers advantageously includes at least two gratings that define respective optical recombination planes, in which the optical recombination planes of the additional grating interferometers are substantially coincident with the recombination plane of the first grating interferometer.

A preferred embodiment of the invention is an optical apparatus that includes a first grating interferometer that receives an input optical beam. The interferometer includes at least two gratings $G_1$ and $G_2$ that together define an optical recombination plane that is a distance d from the grating $G_2$. The distance d is selected such that when the grating interferometer is placed in a lithographic imaging apparatus, then the recombination plane is substantially coincident with a plane in which a reticle of the imaging apparatus is located. The gratings $G_1$ and $G_2$ advantageously have different periodicities and generate sinusoidal output at the recombination plane. The apparatus may further include additional grating interferometers for receiving the input optical beam, in which each of the additional grating interferometers includes at least two gratings that define respective optical recombination planes, and in which the optical recombination planes of the additional grating interferometers are substantially coincident with the recombination plane of the first grating interferometer. The apparatus preferably further includes an optical stop that blocks a portion of optical radiation passing through the interferometer, and the optical stop and the grating interferometer are preferably integrated in a single piece of optical material. A mount may be used for holding the first grating interferometer, the reticle, and the optical stop in a fixed spatial relationship, and the reticle advantageously has a pattern therein that represents information such as fiducial information.

A preferred aspect of the invention is a method of producing a periodic grating pattern and fiducial information on the surface of a radiation sensitive material. The method includes directing optical radiation through an optical apparatus disclosed herein to generate a periodic intensity profile in the surface of a radiation sensitive material, in which the material is located substantially coincident with the output imaging plane. The method further includes generating at least one fiducial mark in the material with optical radiation that passes through the reticle. The optical radiation may be ultraviolet electromagnetic radiation, for example, and the radiation sensitive material may be photoresist on a wafer. In a preferred implementation of the method, the periodic intensity profile and said at least one fiducial mark are generated concurrently. More preferably, a series of sinusoidal intensity profiles is generated in the surface of the photoresist material as a function of exposure dose, in which the sinusoidal intensity profiles include profiles of differing spatial frequencies. The method preferably further includes developing the photoresist and measuring linewidths in the developed photoresist as a function of exposure dose to characterize the spatial response of the photoresist. A modulation transfer function of the photoresist from the measured linewidths can then be determined, and from this, a point-spread function. The method may be automated using a critical dimension scanning electron microscope (CD-SEM).

One preferred aspect of the invention is a method that includes directing light through an optical apparatus that includes an interferometric device onto light-sensitive material, to simultaneously produce in the material i) a sinusoidal intensity profile generated by the interferometric device, and ii) at least one fiducial mark. The method preferably includes simultaneously producing in the material multiple sinusoidal intensity profiles of differing spatial frequencies. The interferometric device preferably produces at least two diffracted orders of substantially equal amplitude that recombine at a reticle that includes at least one fiducial marking having a pattern that is transferred to the light-sensitive material.

BRIEF DESCRIPTION OF THE DRAWINGS

FIG. 2 includes FIGS. 2A, 2B, 2C, and 2D, in which:

FIG. 2A is a plan view of the input face of a grating interferometer that can be used in the apparatus of FIG. 1;

FIG. 2B is a plan view of the output face of the grating interferometer of FIG. 2A;

FIG. 2C is a plan view of a reticle that includes a fiducial marking; and

FIG. 2D is a plan view of photoresist into which both sinusoidal grating patterns and fiducial marks have been lithographically imaged.

DETAILED DESCRIPTION OF THE INVENTION

Figure 1:
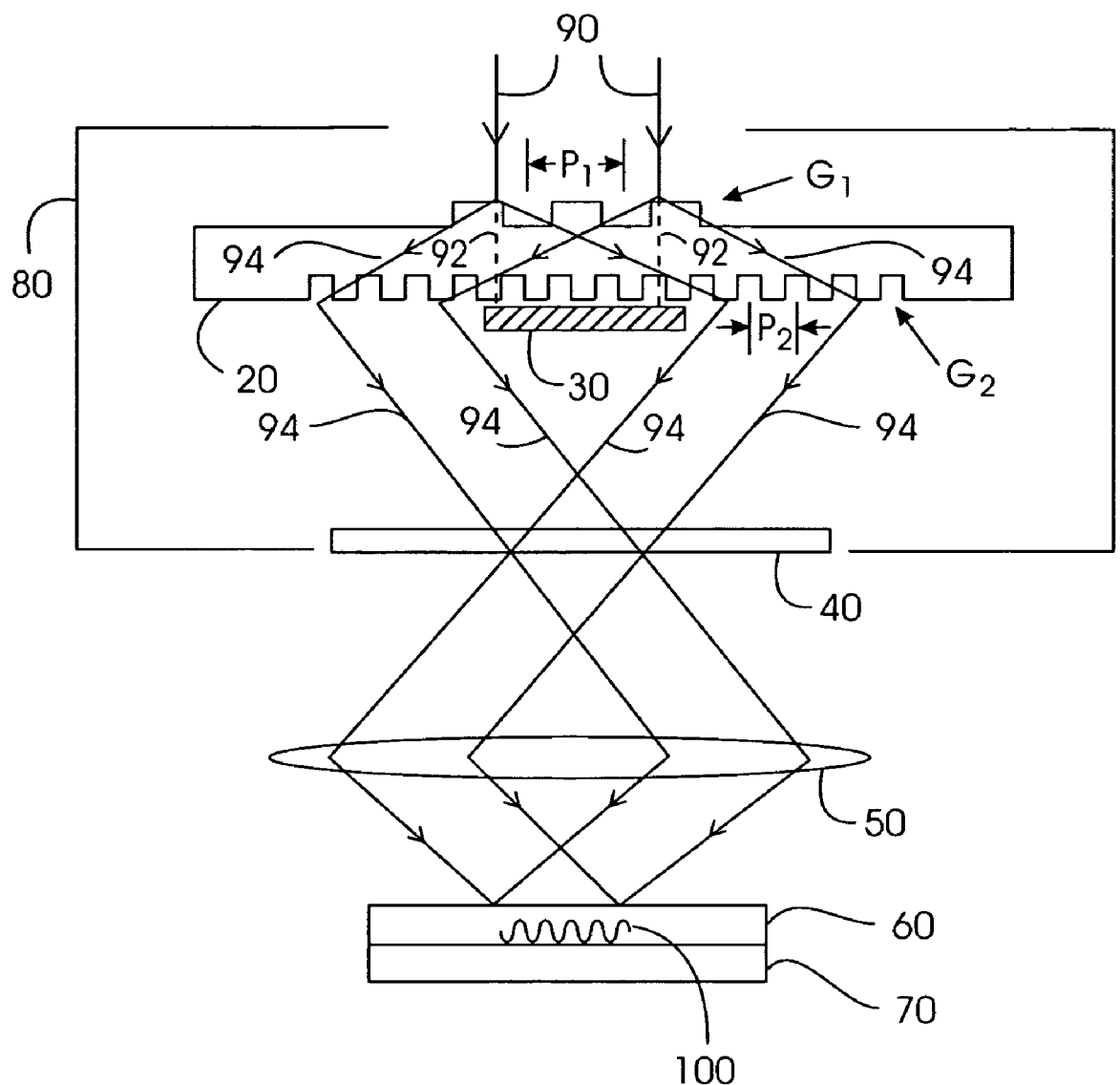
FIG. 1 is a cross sectional schematic of one preferred embodiment showing a specialized grating interferometer integrated with lithographic tooling components.

A diffraction grating may be used to split a beam of light into mutually coherent beams, corresponding to the propagating diffraction orders of the grating. If the grating is placed in the reticle plane of a lithographic projection system, the beams corresponding to the various diffraction orders originating at any single point on the grating recombine at the wafer plane of the system. The angles of incidence of these beams with respect to the normal at the wafer are determined by the pitch of the diffraction grating and the magnification of the projection optics.

If a reticle could be fabricated in such a way as to function as a diffraction grating with only two diffracted orders, each of which had the same intensity and propagated symmetrically with respect to the normal to the reticle, then the projection optics would function essentially as an interferometer, thereby generating a sinusoidal optical grating pattern in the photoresist film at the wafer plane. However, gratings also diffract light into undesired orders and transmit a portion of the incident light without diffraction. (The undiffracted beam is also referred to as the "zeroth order".) If diffracted orders other than the two desired first-order beams are imaged onto the wafer plane, they modify the desired sinusoidal intensity pattern. Because the optical fields interfere coherently, even if only a few percent of the incident intensity is diffracted into undesired orders, that is enough to seriously distort the optical intensity distribution at the wafer. Although it is possible in principle to block undesired diffraction orders with special-purpose apertures or baffles inserted after the reticle (for example, in the manner demonstrated experimentally by M. G. L. Gustafsson, D. A. Agard, and J. W. Sedat, Proceedings of SPIE 3919, pp. 141–150, 2000), photolithographic exposure tools are highly specialized, inflexible instruments, which do not provide for access to the region between the reticle and the wafer.

A preferred optical arrangement that solves this need is now described. (As used herein, the terms "optical" and "light" refer generally to electromagnetic radiation, and may include, for example, ultraviolet and infrared electromagnetic radiation.) An important optical component in this optical arrangement is a specialized grating interferometer 20, as shown in FIG. 1. The grating interferometer 20 includes an input grating $G_1$ and an output grating $G_2$ having respective pitches P1 and P2 that are different. For the preferred embodiments described herein, P1 is greater than P2. An optical stop 30 is positioned on the optical output side of the grating interferometer 20, and in a preferred embodiment, the optical stop is integrated with the gratings $G_1$ and $G_2$ to form a single component, as discussed below in connection with FIG. 2. Light passes through a reticle 40, which is advantageously positioned at the recombination plane of the grating interferometer 20. Lithographic collection optics 50 such as a lens collects light passing through the reticle 40 and direct it towards a film 60 of photoresist or other radiation sensitive medium placed on a wafer or substrate 70. The grating interferometer 20 and the optical stop 30 may be advantageously held in a fixed spatial relationship with respect to the reticle 40 by a mount 80, which may be secured to a fixture (not shown) that holds the reticle. The mount 80, collection optics 50, and substrate 70 are likewise held together in a fixed spatial relationship relative to each other by one or more mounts, fixtures, fittings, or the like (not shown) as part of the lithographic tooling apparatus. The mount 80 positions the grating $G_2$ at a precisely controlled distance from the plane of the reticle 40.

An input optical beam 90 is directed onto the grating interferometer 20, but the zeroth order component 92 of this beam is blocked by the optical stop 30. The two symmetric first order beam components 94 are diffracted in such a way that they constructively interfere to form a sinusoidal interferometric image (not shown in FIG. 1) at the reticle 40 (in which the image is preferably located at that surface of the reticle nearest the collection optics 50). This pattern is then optically projected by the collection optics 50, whose input focal plane is advantageously substantially coincident with the recombination plane of the grating interferometer 20, where the reticle 40 is located. The output imaging plane of the collection optics 50 is advantageously coincident with the photoresist film 60, so that the interferometric image formed in the reticle 40 can be transferred to the film to form a sinusoidal grating pattern 100 therein.

The grating interferometer 20 is preferably designed to generate exactly two coherent beams at the plane of the lithographic tool where the reticle 40 is positioned. In effect, an optical field is produced at the reticle plane that is identical to the one that would have arisen from an idealized (but physically unachievable) grating having only two symmetrical diffracted modes. By using the grating interferometer 20 in this manner, precise sinusoidal grating patterns 100 can be generated with conventional lithographic tooling.

The basic principle of the preferred apparatus described herein is to use the two-grating interferometer 20 to generate an interference pattern at the plane of the reticle 40, which the collection optics 50 transfers (e.g., with demagnification) to the film 60. The optics 50 of the lithographic tool sees the same electromagnetic field that would be produced by an idealized grating (i.e., one having only the −1 and +1 orders of diffraction), without the need to actually make such a physically unrealizable grating.

In particular, the grating $G_2$ preferably has a slightly smaller pitch than does $G_1$, so that as a result of the first-order diffraction of the optical beams 94 incident on $G_2$, light rays which were initially split at $G_1$ recombine in the reticle plane to form an interference pattern which is then demagnified and projected by the exposure tool optics 50 onto the photoresist film 60. Any light diffracted by $G_2$ into diffraction orders other than the desired first order preferably falls outside of the angular acceptance of the projection optics 50, so that it does not affect the sinusoidal pattern formed at the photoresist film 60. Consequently, the optical field formed at the reticle plane is the same as the optical field that would be produced by an idealized grating transmitting only two symmetric first order beams.

By preparing $G_1$ and $G_2$ on two sides of a single piece of transparent optical material such as glass or fused silica, it is possible to build a compact and stable interferometer. As discussed below in connection with FIG. 2, an opaque material may be applied directly to the surface bearing the grating $G_2$ to form an optical stop. Thus, only two symmetric first orders of diffraction reach the reticle plane, even though the gratings $G_1$ and $G_2$ themselves may allow some light to propagate in the zeroth order. If need be, opaque material can be applied to the outer area of the second grating surface to block any second and higher diffraction orders from $G_1$.

The apparatus of FIG. 1 represents a means to integrate interferometric and conventional lithography. By combining the grating interferometer 20 with a reticle 40, it is possible to generate interferometric grating patterns and conventional images with a single exposure, thereby permitting the simultaneous formation of an interferometric grating pattern 100 and one or more alignment marks (and/or other aperiodic patterns) in the film 60. In addition, it is possible to generate several grating patterns 100 of different spatial frequencies in a single exposure, thereby facilitating the efficient and automated generation of accurate sinusoidal grating patterns spanning a large range of spatial frequencies. Using this technique, the various latent grating patterns in the photoresist film 60 may be advantageously developed at the same time, thereby reducing the number of process steps while promoting consistent processing conditions. These advantages are shown in FIG. 2, which shows components that are positioned along the propagation path of the optical beam.

FIG. 2A shows the input face 110 of a grating interferometer that receives the input optical beam 90, as viewed from along its direction of propagation. (This perspective is maintained in FIGS. 2B, 2C, and 2D as well.) The grating interferometer of FIGS. 2A and 2B differs from its counterpart in FIG. 1 in that it includes three pairs of gratings (in principle more or fewer than 3 pairs could be used). The input face of the grating interferometer includes three gratings $G_1a$, $G_1b$, and $G_1c$, which are optically aligned with respective gratings $G_2a$, $G_2b$, $G_2c$ on the grating interferometer's output face 120 (see FIG. 2B). That is to say, the gratings $G_2a$, $G_2b$, $G_2c$ receive the first order diffracted beam 94 and direct it towards the reticle 40.

The input face 110 and the output face 120 include respective clear portions 130, 132 through which light can pass. In addition, the faces 110, 120 include respective optically opaque portions 140, 142 which function as optical stops to block unwanted light. (The gratings $G_2a$, $G_2b$, $G_2c$ are each divided into two portions separated by the optical stop 142.) In particular, the central portion of the opaque portion 142 functions like the optical stop 30 of FIG. 1 by blocking the zeroth order light 92 from the input optical beam 90 (except that in FIG. 1 this is shown as a separate optical component for clarity). The clear portions 130, 132 permit light to be pass straight through the input and output faces 110, 120 and towards the reticle 40, thereby permitting fiducial marks to be imparted to the photoresist film 60, as discussed below in connection with FIG. 2C. The grating interferometers described herein may be made by any one of a number of techniques known to those skilled in the art. For example, the grating interferometer may be one or more quartz or fused silica element(s) into which gratings have been formed, and tantalum or chrome (or another metal or opaque substance) on the element may be used to block unwanted light, thereby acting as an optical stop.

The reticle 40 shown in FIG. 2C is preferably aligned with the recombination plane of the grating pairs $G_1a$, $G_2a$; $G_1b$, $G_2b$; $G_1c$, $G_2c$, so that respective interferometric images 150a, 150b, 150c are formed in the reticle plane from the constructive interference of the first order beam components 94 of the input optical beam 90. The reticle 40 further includes one or more markings 160 (e.g., made from chrome) that represents fiducial information that is to be transferred to the photoresist film 60, along with the interferometric images 150a, 150b, 150c. This information transfer takes place via the collection optics 50 or lens, which may be advantageously placed so that 1) its input focal plane is substantially coincident with the grating interferometer's recombination plane (positioned at the reticle 40) and 2) its output imaging plane is substantially coincident with the photoresist film 60. FIG. 2D shows the film 60 into which the interferometric images 150a, 150b, 150c of FIG. 2C are now demagnified and appear as latent sinusoidal "grating patterns" 170a, 170b, 170c, respectively. The fiducial marking 160 likewise appears as a demagnified, latent image 162 in the film 60. The fiducial marking 160 is optically aligned with the clear portions 130, 132 of the grating interferometer, thereby permitting a portion of the input optical beam 90 to pass through the clear portions 130, 132 and image the fiducial marking 160 onto the film 60.

Since the mount 80 that holds the grating interferometer 20 is advantageously constructed so as to accommodate a conventional absorptive or phase shifting reticle, the imaging optics 50 simultaneously generates a demagnified image of the conventional reticle and an interferometric, sinusoidal grating pattern at the surface of the photoresist film 60. The ability to simultaneously generate an interferometric grating pattern and a conventional image allows the grating pattern 100 in the photoresist film 60 to be located relative to a fiducial mark in the photoresist, which facilitates the subsequent alignment of grating patterns generated in the photoresist film 60.

A preferred photoresist characterization procedure that utilizes the apparatus of FIG. 1 or 2 with the methodology of Hoffnagle et al. consists of the following steps. First, the mount 80 (including a grating interferometer and an optical stop, like the ones of FIG. 1 or 2) is placed in a conventional projection lithographic tool along with the reticle 40. Next, a wafer that has been coated with a film 60 of photoresist and pre-processed as desired is placed in the wafer plane of the lithographic tool. The photoresist is then exposed, creating in the region where two-beam interference takes place one or more sinusoidal latent images (e.g., the grating pattern 100 of FIG. 1, or if multiple patterns are generated, the grating patterns 170a, 170b, 170c as in FIG. 2), as well as a latent image of one or more suitably designed fiducial marks. This exposure step is repeated many times with different optical doses, i.e., different values of integrated fluence are applied to the reticle 40. The wafer is moved between exposure steps (e.g., by a stepper), so that the latent images corresponding to different doses are spatially separated. The wafer is then post-processed and developed, revealing a series of line-space arrays in the interferometrically exposed regions and fiducial marks in the conventionally imaged regions. At this point, the wafer is examined microscopically, and the dimensions of the line-space arrays are measured for each value of spatial frequency and dose. Because the positions of the fiducial marks are accurately known, it is possible to use automated equipment such as a CD-SEM (Critical Dimension-Scanning Electron Microscope) for this step. The methodology of Hofffnagle et al. is applied to the linewidth/dose data to extract the modulation transfer function and the point-spread function, thereby characterizing the photoresist under the given processing conditions. The entire procedure is compatible with standard lithographic tooling and processing and can be fully automated, thereby allowing efficient resist characterization. Information gained in this way is valuable for process optimization and control and for implementing resolution enhancing technology, in addition to characterizing photoresists.

In designing the grating interferometer 20, it is important to consider the construction of the lithographic tool with which it is to be used, and particularly the coherence of the illuminating light. If the input beam 90 incident on the grating $G_1$ has perfect temporal and spatial coherence, then an interference pattern with perfect modulation is present in the entire region over which the two first order beams 94 overlap (i.e., the rhombus around the reticle 40). In practice, lithographic exposure tools illuminate the mask with partially coherent light. Temporal coherence is determined by wavelength bandwidth ($\Delta\lambda$) of the source laser, and spatial coherence is determined by the range of incidence angles at the grating $G_1$ If the nominal incidence angle of the illuminating beam on the reticle is $\theta=0$, then a partially coherent beam can be described as an incoherent superposition of beams with incidence angles $0<\theta<\Delta\theta$. For an exposure tool using an ArF laser operating at $\lambda=193.3$ nm, typical values of these parameters are $\Delta\lambda=0.5$ nm and $\Delta\theta=0.007$ radians.

A two-grating interferometer with partially coherent illumination has been analyzed by Y.-S. Cheng (see Applied Optics, 23, pp. 3057–3059, 1984). To compute the performance of the apparatus disclosed herein, Cheng's analysis must be generalized by including the index of refraction of the medium between $G_1$ and $G_2$. Moreover, it is important to recognize that the small-angle approximation that underlies many of the explicit expressions derived by Cheng is inadequate for precise design work. The analysis of Cheng shows that the effect of partial coherence is to reduce the modulation depth of the interference fringes in the rhombus around the plane in which the reticle 40 is located. If the pitches of $G_1$ and $G_2$ are not too different, which is the preferred embodiment, then the modulation of the interference fringes in the plane of the reticle 40 is nearly perfect, but fringes of high modulation are only formed in the region within a small distance $\Delta z$ of the reticle plane. Both the depth-of-focus and the focal plane adjustment range of a high numerical aperture lithographic exposure tool are very small, and so consequently it is generally necessary that the distance between $G_2$ and the reticle 40 be accurately adjusted. As shown in FIGS. 2A and 2B, a grating interferometer can include multiple grating pairs ($G_1a$, $G_2a$; $G_1b$, $G_2b$; $G_1c$, $G_2c$) of different pitches, thereby generating with a single exposure a series of sinusoidal grating patterns 170a, 170b, 170c in the photoresist film 60 at the wafer plane. In this case, the pitches of the various grating pairs ($G_1a$, $G_2a$; $G_1b$, $G_2b$; $G_1c$, $G_2c$) should be chosen such that the first order beams 94 recombine in the same plane, which is preferably substantially coincident with the nominal plane of the reticle 40. Suitable pitches for $G_1$ and $G_2$ can be selected using geometry and the grating equation.

As an example of a particular design of practical value, consider the case in which the input optical beam 90 has a wavelength of 193 nm, and the goal is to write a series of gratings covering the range from 170 nm to 600 nm pitch with a single exposure. The imaging optics in the exposure tool is assumed to have a demagnification factor of 10× and a numerical aperture of 0.6. The wavelength and coherence parameters of the laser beam are assumed to be as given above. (In the context of lithographic tools, it is more common to describe spatial coherence by the so-called sigma parameter; the value $\Delta\theta=0.007$ radian stated above corresponds to $\sigma=0.1$ for this example.) The grating interferometer is assumed to be constructed from fused silica, which has an index of refraction n=1.560294 at 193 nm. The thickness of the silica is taken to be 2.36 mm. The distance from the output grating $G_2$ to the reticle 40 is chosen to be 16 mm, in order for the grating interferometer to fit in the limited space between the plane of the reticle 40 and the illumination optics (not shown). The grating interferometer of this example is designed so that a series of gratings with 7 different spatial frequencies are simultaneously produced in the reticle plane. After photoreduction by the lithography collection optics 50, the grating pitch in the photoresist film 60 at the wafer plane spans the desired wide range of spatial frequencies. The required pitches for the gratings $G_1$ and $G_2$ are presented in Table 1 below. The gratings $G_1$ and $G_2$ have pitches considerably larger than those of the grating patterns 170a, 170b, 170c that are ultimately produced in the photoresist film 60, which simplifies the fabrication of these gratings. The half-width $\Delta z$ of the region containing fringes with ranges of modulation greater than 90% is greater than 25 µm for all the grating pairs, thereby making the mechanical alignment of the grating interferometer straightforward.

The invention may be embodied in other specific forms without departing from its spirit or essential characteristics. The described embodiments are to be considered in all respects only as illustrative and riot restrictive. The scope of the invention is therefore indicated by the appended claims rather than the foregoing description. All changes within the meaning and range of equivalency of the claims are to be embraced within that scope.

TABLE 1

| Grating pitch at wafer [nm] | Period of $G_1$ [nm] | Period of $G_2$ [nm] |
|---|---|---|
| 170 | 344.0 | 312.4 |
| 200 | 397.5 | 361.1 |
| 250 | 488.3 | 444.8 |
| 300 | 580.3 | 529.1 |
| 400 | 766.1 | 699.2 |
| 500 | 953.2 | 870.3 |
| 600 | 1141.0 | 1041.9 |

What is claimed is:
1. A method, comprising:
 directing light through an optical apparatus that includes an interferometric device onto light-sensitive material, to simultaneously produce in the material:
 i) a sinusoidal intensity profile generated by the interferometric device; and
 ii) at least one fiducial mark.

2. The method of claim 1, comprising simultaneously producing in the material multiple sinusoidal intensity profiles of differing spatial frequencies.

3. The method of claim 2, wherein:
the interferometric device produces at least two diffracted orders of substantially equal amplitude that recombine at a reticle that includes at least one fiducial marking having a pattern that is transferred to the light-sensitive material.

4. The method of claim 1, wherein the light includes ultraviolet electromagnetic radiation.

5. The method of claim 1, wherein the material includes photoresist.

6. The method of claim 5, wherein a series of sinusoidal intensity profiles is generated in the surface of the photoresist as a function of exposure dose.

7. The method of claim 6, wherein the sinusoidal intensity profiles include profiles of differing spatial frequencies.

8. The method of claim 7, further comprising:
developing the photoresist; and
measuring linewidths in the developed photoresist as a function of exposure dose to characterize the spatial response of the photoresist.

9. The method of claim 8, further comprising deducing a modulation transfer function of the photoresist from the measured linewidths.

10. The method of claim 9, further comprising determining a point-spread function from the modulation transfer function.

11. The method of claim 10, wherein the method is automated using a critical dimension scanning electron microscope (CD-SEM).

12. A method for use with an optical apparatus that includes a reticle and an interferometric device, the method comprising:
directing ultraviolet radiation through the optical apparatus onto photoresist material, to simultaneously produce in the photoresist material:
i) a sinusoidal intensity profile generated by the interferometric device; and
ii) at least one fiducial mark resulting from ultraviolet radiation passing through the reticle, the reticle having a pattern therein that corresponds to said at least one fiducial mark.

13. The method of claim 12, comprising simultaneously producing in the photoresist material multiple sinusoidal intensity profiles of differing spatial frequencies.

14. The method of claim 12, wherein the optical apparatus includes an optical stop that blocks a portion of the ultraviolet radiation passing through the interferometric device.

15. The method of claim 12, comprising blocking zeroth order ultraviolet radiation passing through the interferometric device.

16. The method of claim 15, wherein a series of sinusoidal intensity profiles is generated in the photoresist material as a function of exposure dose.

17. The method of claim 16, wherein the sinusoidal intensity profiles include profiles of differing spatial frequencies.

18. The method of claim 17, further comprising:
developing the photoresist material; and
measuring linewidths in the developed photoresist material as a function of exposure dose to characterize the spatial response of the photoresist material.

19. The method of claim 18, further comprising deducing a modulation transfer function of the photoresist material from the measured linewidths.

20. The method of claim 19, further comprising determining a point-spread function from the modulation transfer function.

21. The method of claim 20, wherein the method is automated using a critical dimension scanning electron microscope (CD-SEM).

* * * * *